(12) United States Patent
Wei

(10) Patent No.: US 9,013,873 B2
(45) Date of Patent: Apr. 21, 2015

(54) CONTAINER DATA CENTER

(71) Applicant: Hon Hai Precision Industry Co., Ltd., New Taipei (TW)

(72) Inventor: Chao-Ke Wei, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 229 days.

(21) Appl. No.: 13/711,490

(22) Filed: Dec. 11, 2012

(65) Prior Publication Data

US 2014/0146465 A1 May 29, 2014

(30) Foreign Application Priority Data

Nov. 23, 2012 (TW) ................................. 101144072

(51) Int. Cl.
*H05K 7/20* (2006.01)
*G06F 1/20* (2006.01)

(52) U.S. Cl.
CPC .............. *G06F 1/20* (2013.01); *H05K 7/20263* (2013.01); *H05K 7/20172* (2013.01); *G06F 2200/201* (2013.01); *H05K 7/20736* (2013.01); *H05K 7/20781* (2013.01)

(58) Field of Classification Search
USPC ............................................... 361/696, 701
See application file for complete search history.

(56) References Cited

U.S. PATENT DOCUMENTS

| 7,511,960 | B2 * | 3/2009 | Hillis et al. | 361/702 |
| 7,856,838 | B2 * | 12/2010 | Hillis et al. | 62/259.2 |
| 7,862,410 | B2 * | 1/2011 | McMahan et al. | 454/184 |
| 8,462,504 | B2 * | 6/2013 | Chen et al. | 361/696 |
| 2004/0100770 | A1 * | 5/2004 | Chu et al. | 361/698 |
| 2005/0061485 | A1 * | 3/2005 | Hirafuji et al. | 165/104.21 |
| 2009/0225513 | A1 * | 9/2009 | Correa et al. | 361/700 |
| 2010/0033931 | A1 * | 2/2010 | Miyazawa et al. | 361/696 |
| 2010/0307716 | A1 * | 12/2010 | Bean et al. | 165/80.2 |
| 2011/0042616 | A1 * | 2/2011 | Seitz et al. | 252/301.4 H |
| 2013/0032310 | A1 * | 2/2013 | Jaena et al. | 165/104.25 |

* cited by examiner

*Primary Examiner* — Gregory Thompson
(74) *Attorney, Agent, or Firm* — Novak Druce Connolly Bove + Quigg LLP

(57) ABSTRACT

A container data center includes a container and a server cabinet received in the container. The server cabinet includes a rack and a number of heat dissipation devices mounted to a rear side of the rack. Each heat dissipation device includes a case fixed to the rack, a fan mounted to an outer side of the case, and a heat dissipation plate received in the case and aligning with the fan. The heat dissipation plate defines a vent. The fan draws heat air through the vent of the heat dissipation plate from the rack, and the heat air is cooled by refrigerant received in the heat dissipation plate to become cool air. The cool air flows in the container, and circularly flows into the cabinet from a front side of the cabinet.

15 Claims, 5 Drawing Sheets

CONTAINER DATA CENTER

BACKGROUND

1. Technical Field

The present disclosure relates to a container data center.

2. Description of Related Art

A container data center generally includes a container and a plurality of cabinets received in the container. Many servers are densely arranged in the cabinets. Each server includes at least one power supply device, a motherboard, a hard disk drive, and an optical disk drive, and thus considerable heat is generated during operation of the server. The servers may suffer damage if the heat is not efficiently removed.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The present disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
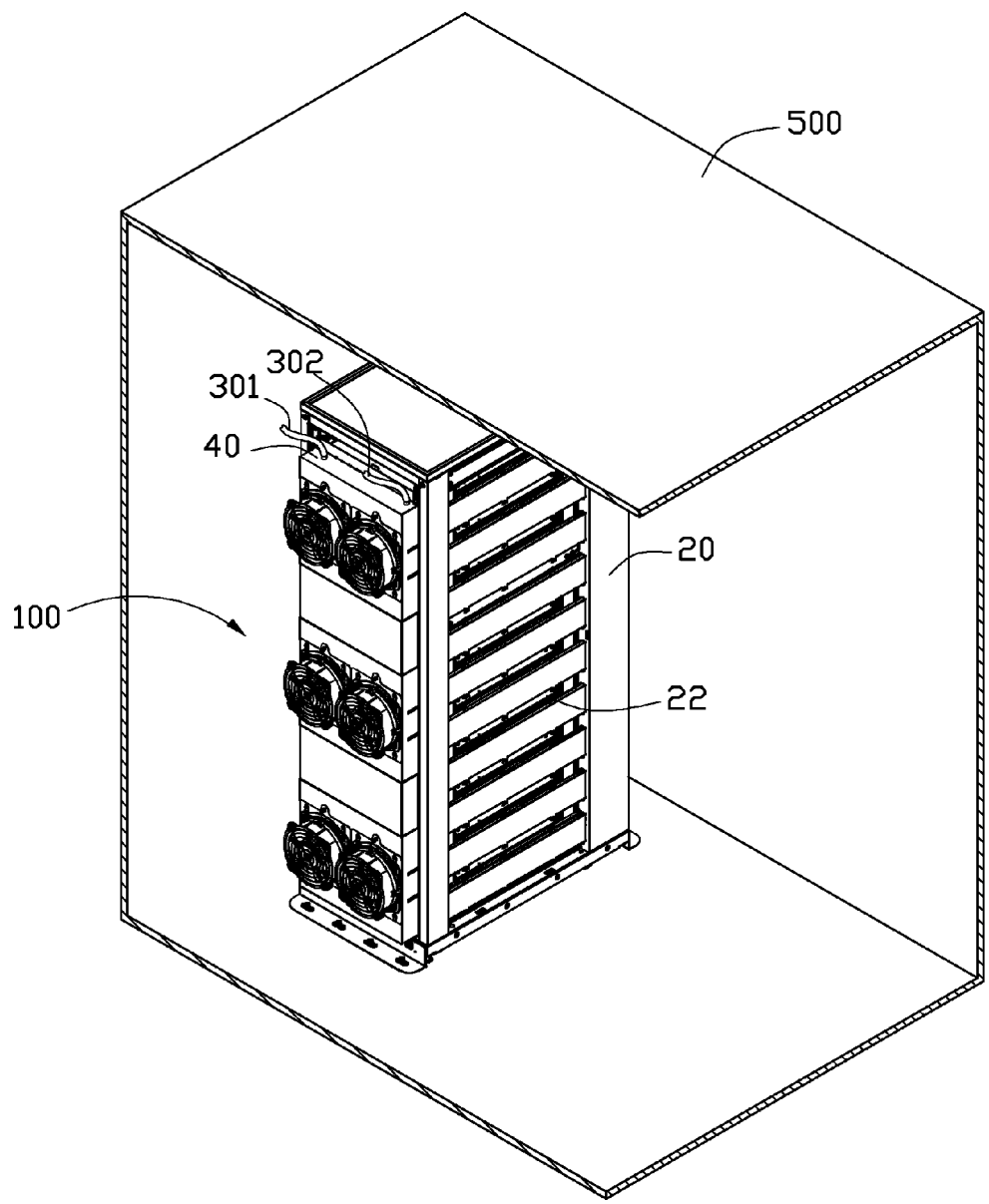
FIG. 1 is an isometric, partially cutaway view of an exemplary embodiment of a container data center, wherein the container data center includes a container and a cabinet received in the container, the cabinet includes a plurality of heat dissipation devices.

FIG. 1 shows an exemplary embodiment of a container data center. The container data center includes a container 500 and a plurality of cabinets 100 received in the container 500. Each cabinet 100 includes a rack 20, a plurality of heat dissipation devices 40 installed to a rear end of the rack 20, and many servers 22 densely arranged in the rack 20. A refrigerant input pipe 301 and a refrigerant output pipe 302 are connected to each heat dissipation device 40.

Figure 2:
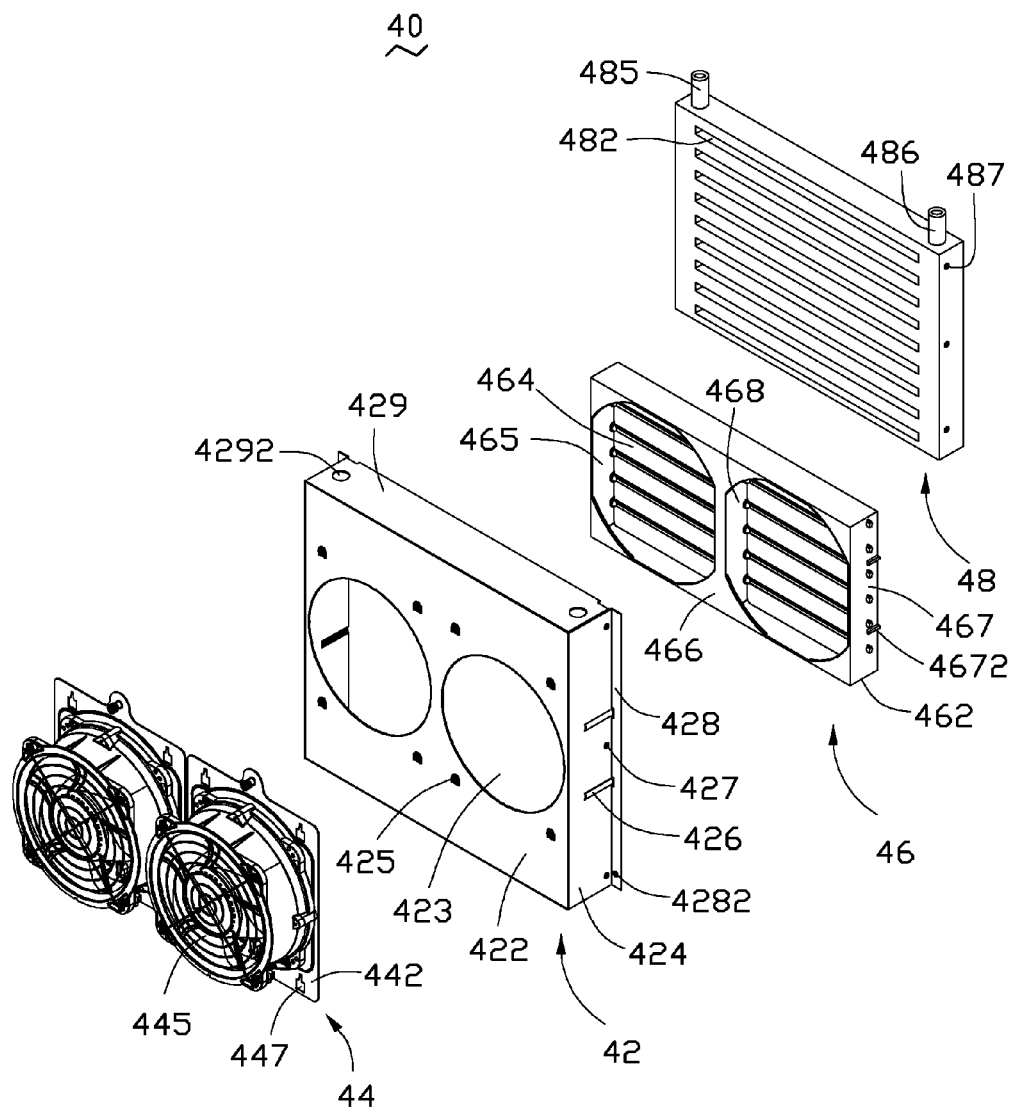
FIG. 2 is an exploded, enlarged view of one of the heat dissipation devices of FIG. 1, wherein the heat dissipation device includes a heat dissipation plate.
Figure 3:
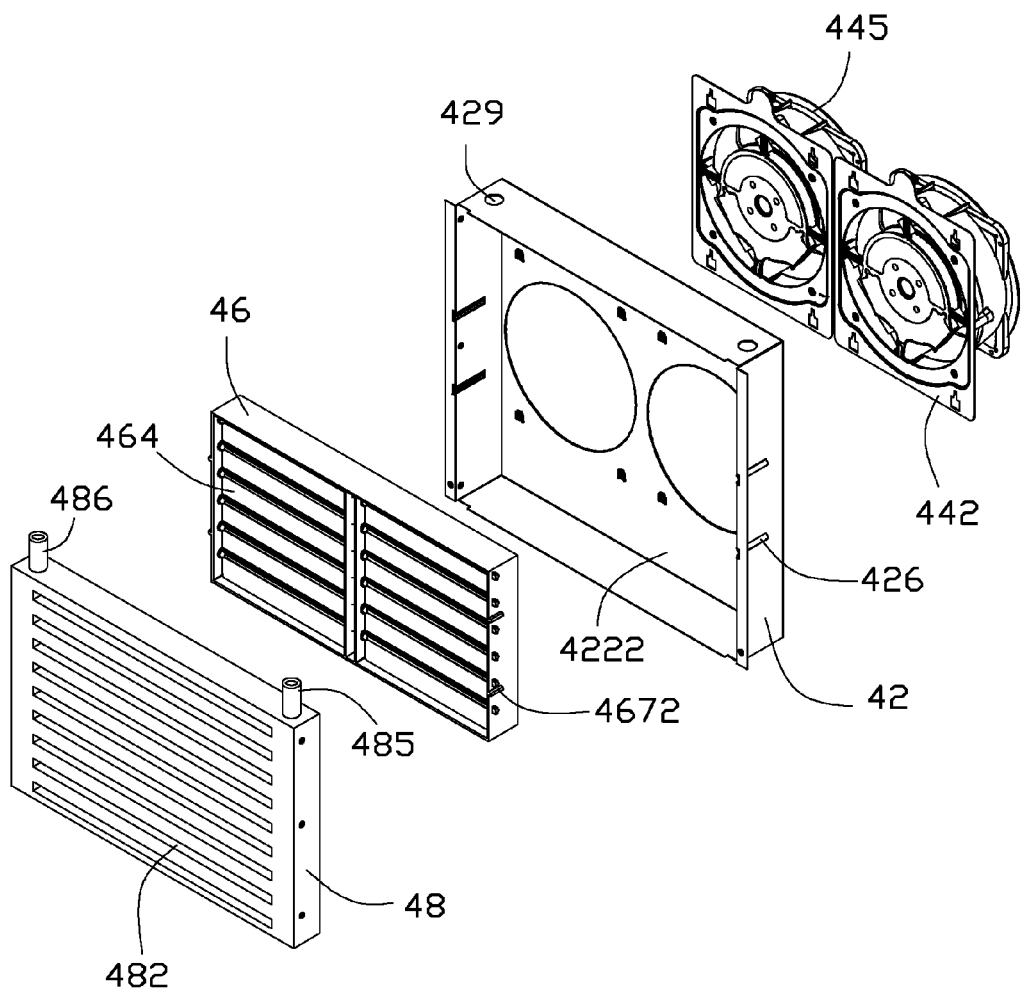
FIG. 3 is similar to FIG. 1, but viewed from another perspective.

FIG. 2 and FIG. 3 show one of the heat dissipation devices 40. The heat dissipation device 40 includes a case 42, two fan modules 44, a baffling apparatus 46, and a heat dissipation plate 48.

The case 42 includes a rectangular position wall 422, two sidewalls 424 perpendicularly extending forward from left and right sides of the position wall 422, and a top wall 429 perpendicularly extending forward from a top of the position wall 422. The position wall 422, the sidewalls 424, and the top wall 429 cooperatively bound a receiving space 4222. The position wall 422 defines two openings 423 communicating with the receiving space 4222. Four hooks 425 protrude rearward from the position wall 422 around each opening 423. Each sidewall 424 defines two latching slots 426 communicating with the receiving space 4222 and parallel to the top wall 429, and a plurality of through holes 427 away from the position wall 422. A flange 428 perpendicularly protrudes out from a front side of each sidewall 424 away from the position wall 422. Each flange 428 defines a plurality of mounting holes 4282. The top wall 429 defines two through holes 4292.

Each fan module 44 includes a rectangular mounting plate 442 and a fan 445 mounted to the mounting plate 442. Four corners of the mounting plate 442 each define a latching hole 447, respectively.

The baffling apparatus 46 includes a bracket 462 and a plurality of baffling plates 464. The bracket 462 includes a rear plate 466 defining two air outlets 465, two side plates 467 perpendicularly extending forward from left and right sides of the rear plate 466, and a middle plate 468 extending forward from the rear plate 466 between the air outlets 465. The baffling plates 464 are rotatably installed between the middle plate 468 and each of the side plates 467, respectively. Two latching bars 4672 protrude out from each side plate 467, and extend along a direction perpendicular to the rear plate 466.

Figure 4:
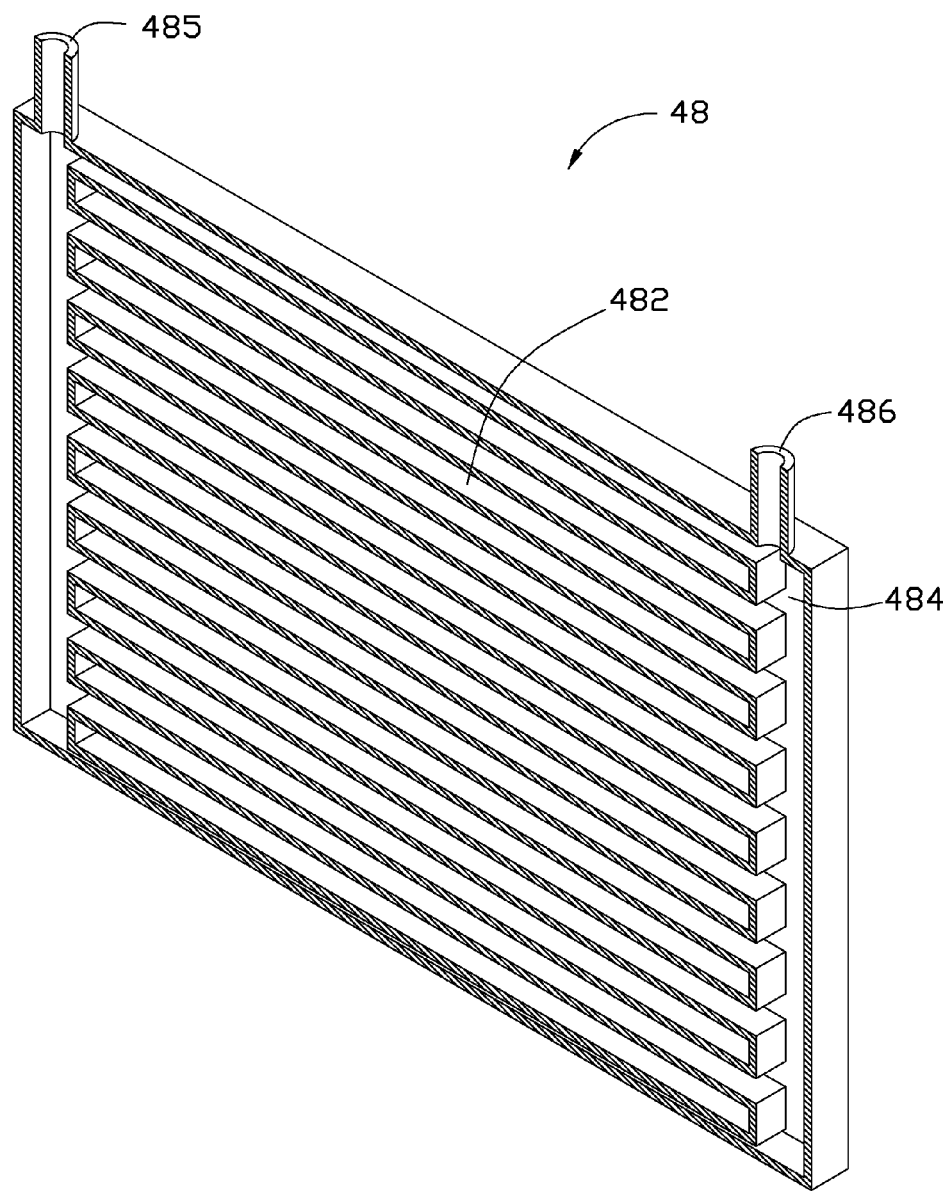
FIG. 4 is an enlarged, cross-sectional view of the heat dissipation plate of FIG. 2.

FIG. 4 shows the heat dissipation plate 48. The heat dissipation plate 48 is rectangular, and defines a plurality of long vents 482 extending from left to right. A refrigerant duct 484 is defined in the heat dissipation plate 48. The refrigerant duct 484 includes a refrigerant input end 485 and a refrigerant output end 486 respectively extending through two ends of a top plate of the heat dissipation plate 48. A left side and a right side of the heat dissipation plate 48 respectively define a plurality of screw holes 487. The heat dissipation plate 48 is made of heat conduction material, such as aluminum, steel, or copper, and is integrally formed. The refrigerant input end 485 is connected to the refrigerant input pipe 301, and the refrigerant output end 486 is connected to the refrigerant output pipe 302.

In assembly of the heat dissipation device 40, the baffling apparatus 46 is received in the receiving space 4222 of the case 42. The air outlets 465 are respectively aligned with the openings 423, and the latching bars 4672 are respectively latched in the latching slots 426. The heat dissipation plate 48 is received in the receiving space 4222. The refrigerant input end 485 and the refrigerant output end 486 are respectively inserted into the through holes 4292 of the top wall 429 from the receiving space 4222. A plurality of screws extends through the through holes 427 of the sidewalls 424, to be screwed into the screw holes 487 of the heat dissipation plate 48, respectively. The fan modules 44 are respectively aligned with the openings 423 of the case 42, and the hooks 425 are respectively latched into the latching holes 447.

In assembly of each heat dissipation device 40 to the rack 20, a plurality of screws respectively extends through the mounting holes 4282 of the case 42, to be screwed into a rear wall of the rack 20.

Figure 5:
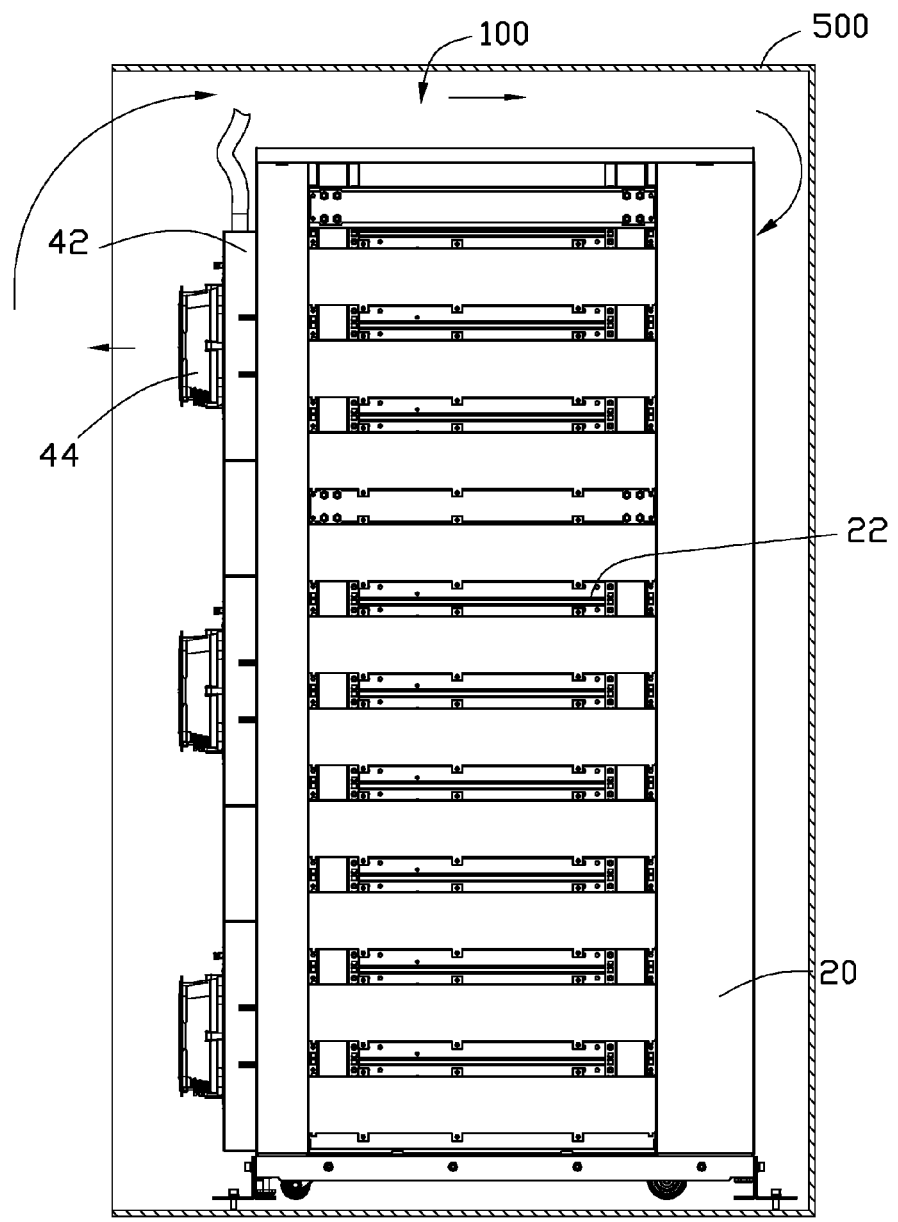
FIG. 5 is a right-side plan view of FIG. 1, showing the container data center in use.

Referring to FIG. 5, a considerable heat is generated by the servers 22 during operation. Refrigerant flows into the refrigerant duct 484 of the heat dissipation plate 48 from the refrigerant input end 485, and flows out of the refrigerant duct 484 from the refrigerant output end 486. The refrigerant can be liquid, such as cold water, or the refrigerant can be cool air. The fans 445 draw the heat air through the vents 482 of the heat dissipation plate 48 from the rack 20. The heat air of the heat dissipation plate 48 is cooled by the refrigerant to become cool air. The baffling plates 464 are rotated to uncover the air outlets 465 by the cool air. Thus, the cool air flows through the air outlets 465 of the baffling apparatus 46, the openings 425 of the cases 42, and the fans 455 to enter the container 500 in that order. The cool air can flow into the cabinet 100 from a front end of the cabinet 100. Therefore, the cool air is circular to dissipate the heat of the cabinet 100.

When one of the fan 445 of the heat dissipation devices 40 is not operating, the baffling plates 464 are rotated back to cover the corresponding air outlet 465, to baffle the cool air to reflow into the receiving space 4222 of the case 42 from the fan 445.

Even though numerous characteristics and advantages of the embodiments have been set forth in the foregoing description, together with details of the structure and function of the embodiments, the present disclosure is illustrative only, and changes may be made in details, especially in the matters of shape, size, and arrangement of parts within the principles of the embodiments to the full extent indicated by the broad general meaning of the terms in which the appended claims are expressed.

What is claimed is:

1. A server cabinet, comprising:
   a rack;
   a plurality of servers installed in the rack; and
   a plurality of heat dissipation devices mounted to the rack;
   wherein each heat dissipation device comprises a case fixed to the rack, a fan mounted on an outer side of the case, and a heat dissipation plate received in an inner side of the case and aligning with the fan, refrigerant is received in the heat dissipation plate, the heat dissipation plate defines a vent, the fan draws heat air through the vent of the heat dissipation plate from the rack, the heat air is cooled by the refrigerant of the heat dissipation plate.

2. The server cabinet of claim 1, wherein the case comprises a position wall, two sidewalls extending forward from two opposite sides of the position wall, and a top wall extending forward from a top of the position wall, the position wall, the top wall, and the sidewalls cooperatively bound a receiving space, the fan is mounted to an outer side of the position wall, and the heat dissipation plate is received in the receiving space.

3. The server cabinet of claim 2, wherein the top wall of the case defines two through holes, a refrigerant duct is defined in the heat dissipation plate, the refrigerant duct comprises a refrigerant input end and a refrigerant output end respectively extending through the heat dissipation plate, to be inserted into the through holes.

4. The server cabinet of claim 3, wherein the refrigerant input end is connected to a refrigerant input pipe, and the refrigerant output end is connected to a refrigerant output pipe.

5. The server cabinet of claim 2, wherein each of the sidewalls of the case defines a plurality of through holes, a left side and a right side of the heat dissipation plate respectively define a plurality of screw holes, a plurality of screws respectively extends through the through holes, to be screwed into the screw holes of the heat dissipation plate.

6. The server cabinet of claim 2, wherein each heat dissipation device further comprises a baffling apparatus received in the receiving space between the fan and the heat dissipation plate.

7. The server cabinet of claim 6, wherein the baffling apparatus comprises a bracket latched in the case and a plurality of baffling plates rotatably installed in the bracket.

8. The server cabinet of claim 1, wherein the heat dissipation plate is made of heat conduction material.

9. The server cabinet of claim 8, wherein the heat conduction material is cuprum.

10. The server cabinet of claim 1, wherein the refrigerant is liquid.

11. The server cabinet of claim 1, wherein the refrigerant is cool air.

12. A container data center, comprising:
    a container; and
    a server cabinet received in the container, and comprising a rack and a plurality of heat dissipation devices mounted to a rear side of the rack, wherein each heat dissipation device comprises a case fixed to the rack, a fan mounted on an outer side of the case, and a heat dissipation plate received in the case and aligning with the fan, the heat dissipation plate defines a vent and receives refrigerant, the fan draws heat air through the vent of the heat dissipation plate from the rack, the heat air is cooled by the refrigerant of the heat dissipation plate to become cool air, the cool air flows in the container, and circularly flows into the cabinet from a front side of the cabinet.

13. The container data center of claim 12, wherein the case comprises a position wall, two sidewalls extending forward from two opposite sides of the position wall, and a top wall extending forward from a top of the position wall, the position wall, the top wall, and the sidewalls cooperatively bound a receiving space, the fan is mounted to an outer side of the position wall, and the heat dissipation plate is received in the receiving space.

14. The container data center of claim 13, wherein the top wall of the case defines two through holes, a refrigerant duct is defined in the heat dissipation plate, the refrigerant duct comprises a refrigerant input end and a refrigerant output end respectively extending through the heat dissipation plate, to be inserted into the through holes.

15. The container data center of claim 14, wherein the refrigerant input end is connected to a refrigerant input pipe, and the refrigerant output end is connected to a refrigerant output pipe.

* * * * *